United States Patent
Hwang (12)

(10) Patent No.: US 6,180,542 B1
(45) Date of Patent: Jan. 30, 2001

(54) METHOD FOR FORMING A HIGH-PERMITTIVITY DIELECTRIC FILM USE IN A SEMICONDUCTOR DEVICE

(75) Inventor: Chul Ju Hwang, Songnam-shi (KR)

(73) Assignee: Ju Sung Engineering Co., Ltd. (KR)

( * ) Notice: Under 35 U.S.C. 154(b), the term of this patent shall be extended for 0 days.

(21) Appl. No.: 09/418,188

(22) Filed: Oct. 12, 1999

(30) Foreign Application Priority Data

Oct. 9, 1998 (KR) .................................................. 98-42154

(51) Int. Cl.$^7$ ............................ H01L 21/31; H01L 21/469
(52) U.S. Cl. ........................... 438/785; 438/778; 438/786
(58) Field of Search .................................. 438/785, 778, 438/758, 786, 788

(56) References Cited

U.S. PATENT DOCUMENTS

| | | | |
|---|---|---|---|
| 3,558,461 | * 1/1971 | Parisi | ..................................... 204/192 |
| 4,649,088 | * 3/1987 | Mitsui et al. | ......................... 428/697 |
| 5,248,629 | * 9/1993 | Muroyama | .............................. 437/52 |
| 5,685,968 | * 11/1997 | Hayakawa | ............................ 205/122 |

\* cited by examiner

*Primary Examiner*—Son T. Dihn
*Assistant Examiner*—Bradley K Smith
(74) *Attorney, Agent, or Firm*—Marger Johnson & McCollom, P.C.

(57) ABSTRACT

A method for forming a tantalum oxynitride film which is used as a high-permittivity dielectric film of a semiconductor device. In the method of the present invention, a tantalum-containing film is first formed on a semiconductor substrate, and then the tantalum-containing film is converted into a tantalum oxynitride film using a heat treatment or a plasma treatment in a reactive gas. According to the method of the present invention, the tantalum oxynitride film can be easily formed using process conditions established in prior art processes.

9 Claims, 3 Drawing Sheets

METHOD FOR FORMING A HIGH-PERMITTIVITY DIELECTRIC FILM USE IN A SEMICONDUCTOR DEVICE

BACKGROUND OF THE INVENTION

1. Field of the Invention

The present invention relates to a method for forming a dielectric film, and more particularly, to a method for forming a high-permittivity dielectric film for use in a semiconductor device.

2. Description of the Prior Art

As the overall dimensions of semiconductor devices continue to shrink, the demand is ever increasing for devices having large charge storage capacity. The need for large charge storage capacity remains even though individual components are scaled to smaller dimensions. As the surface area of a component, such as a capacitor, is reduced, a corresponding reduction in charge storage capability occurs. The smaller surface area available for components, such as transistors, capacitors, and the like, coupled with the requirement to maintain high charge storage levels, has led researchers in the field of fabrication science to seek new materials from which to construct the components. One group of promising new dielectric materials is the family of high-permittivity ferroelectric materials such as tantalum pentoxide ($Ta_2O_5$), BST (($Ba,Sr$)$TiO_3$), or PZT ($Pb(Zr_{1-x}Ti_x)O_3$).

While the ferroelectric materials offer a substantial improvement in compact charge storage capability, the use of the ferroelectric components in MOS integrated circuit technology has been limited by the physical and chemical characteristics of the ferroelectric materials. For example, stoichiometrically the $Ta_2O_5$ film frequently runs short of oxygen, resulting in permittivity degradation and undesired leakage current characteristics. Moreover, the $Ta_2O_5$ film has a bad interface characteristic with a polysilicon film or a metal nitride film commonly used as an upper electrode, and is in a high intrinsic stress state, thus remaining many problems to be solved.

In case of using a $Ta_2O_5$ film as a capacitor dielectric film according to the prior art techniques, the stoichiometrical shortage of oxygen becomes severe by residual gases or byproducts, resulting in undesired leakage current increase. Additionally, if post-thermal treatment is performed in an oxygen atmosphere and at a temperature of 800° C. or more after the formation of the $Ta_2O_5$ film, gases are overflowed, and thus an amorphous $Ta_2O_5$ film is crystallized into a columnar structure. At this time, oxygen diffuses quickly along grain boundaries, and a silicon oxynitride (SiON) film is thus thickly formed between a polysilicon layer and a $Ta_2O_5$ film in the case of using a polysilicon layer as a lower electrode. This adversely effects the realization of high capacitance promised by the $Ta_2O_5$ film. In the case of using a metal nitride film as an upper electrode of the capacitor, an interface reaction occurs between the $Ta_2O_5$ film and the metal nitride film, so that the electrical characteristics of the capacitor deteriorates due to poor adhesion therebetween.

Accordingly, the present inventor proposed a method for fabricating a semiconductor device using tantalum oxynitride films instead of $Ta_2O_5$ films in the present inventor's co-pending Korean patent applications 98-31766 and 98-32106. However, the techniques disclosed in the prior applications include forming a tantalum oxynitride film directly from the reaction between the respective gases containing tantalum, nitrogen and oxygen, which are not compatible with the conventional processes for forming a tantalum oxide film or a tantalum nitride film. Thus, there is a need for seeking optimized process conditions to form a tantalum oxynitride film directly.

SUMMARY OF THE INVENTION

Therefore, it is an object of the present invention to overcome the above problems encountered in prior arts and to provide a method for forming a high-permittivity dielectric film with improved dielectric characteristics and stability compared to the prior art capacitor dielectric.

It is another object of the present invention to provide a method for forming a high-permittivity dielectric film using process conditions established in prior art processes.

In accordance with the present invention, a tantalum-containing film is first formed on a semiconductor substrate which is mounted in a reactor of semiconductor processing equipment, and then converted into a tantalum oxynitride film by a heat treatment or a plasma treatment in a reactive gas ambient.

In the step of forming the tantalum-containing film, the source of tantalum is preferably selected from the group consisting of $TaCl_5$, $Ta(N(CHO)_2)_5$, $Ta(N(C_2O_5)_2)_5$, $Ta(N(COR)_2)_5$, $Ta(NR_2)_5$, $Ta(OC_2H_5)_{5-n}(OCH_2CH_2OR)_n$, and $Ta(OC_2H_5)_5$, wherein $1 \leq n \leq 5$ and n is an integer and R is an alkyl group.

At this time, if the tantalum-containing film is a tantalum oxide film, the reactive gas can be selected from the nitrogen-containing gas group consisting of $N_2$, $NH_3$ and $N_2O$.

If the tantalum-containing film is a tantalum nitride film, the reactive gas can be selected from the oxygen-containing gas group consisting of $O_2$, $O_3$ and $N_2O$.

Prior to the formation of the tantalum-containing film, the surface of the semiconductor substrate can be cleaned by plasmas of hydrogen-containing gas.

It is preferable that the stoichiometric ratio of nitrogen to oxygen in the converted tantalum oxynitride film is in the range of 1:9~3:2, for both cases.

It is also preferable that the converted tantalum oxynitride film is plasma-treated using the plasmas of a gas selected from the group consisting of an oxygen-containing compound gas, a nitrogen-containing compound gas, and a hydrogen-containing compound gas to provide a better film quality.

DESCRIPTION OF THE PREFERRED EMBODIMENT

Hereinafter, the tantalum oxynitride film formation methods, which are different from each other depending upon the types of the tantalum-containing film, will be described with reference to FIGS. 1A through 2C.

EXAMPLE 1

Figure 1A:
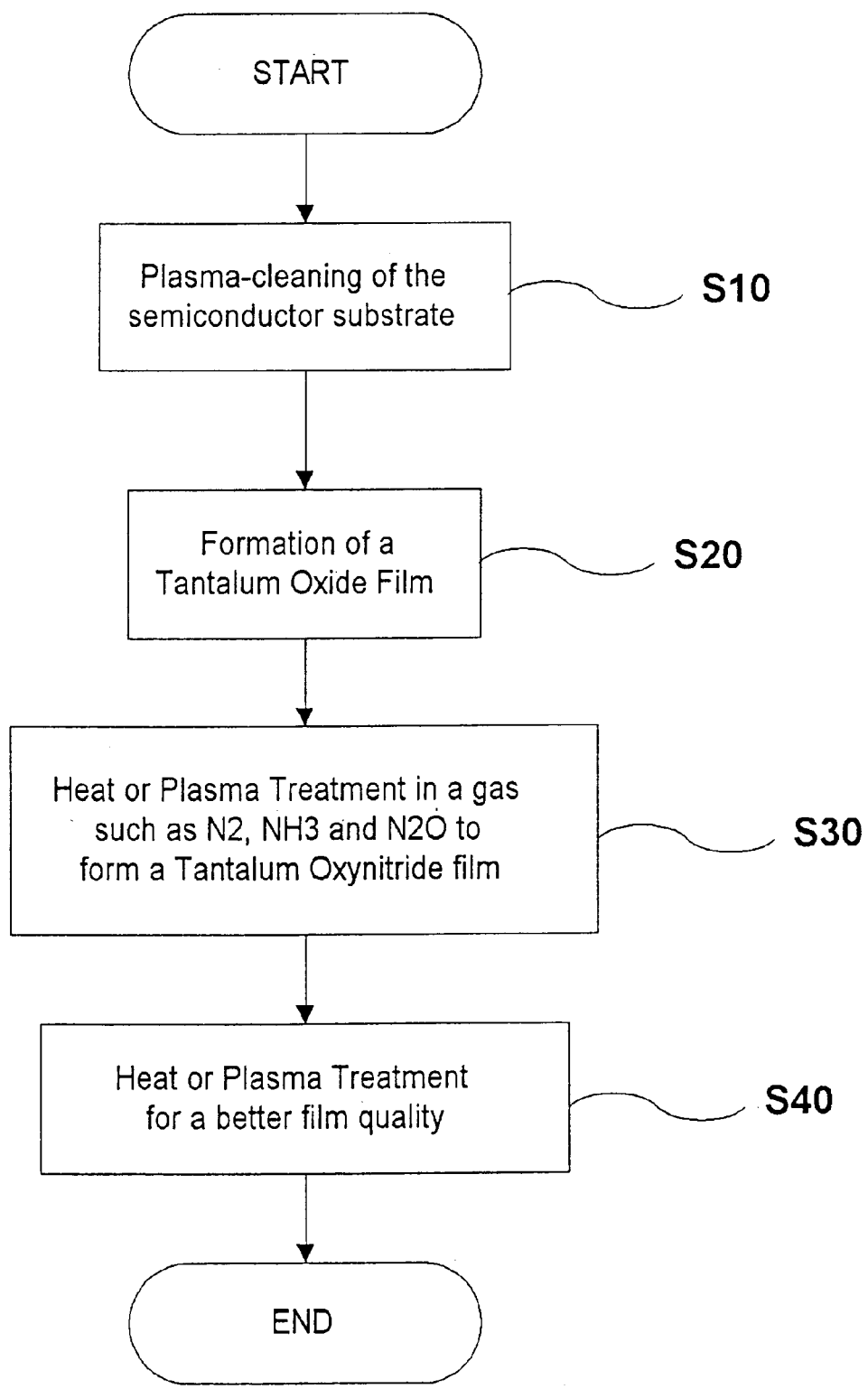
FIGS. 1A and 1B are flowcharts illustrating process sequences for forming a tantalum oxynitride film according to the embodiments of the present invention.
Figure 1B:
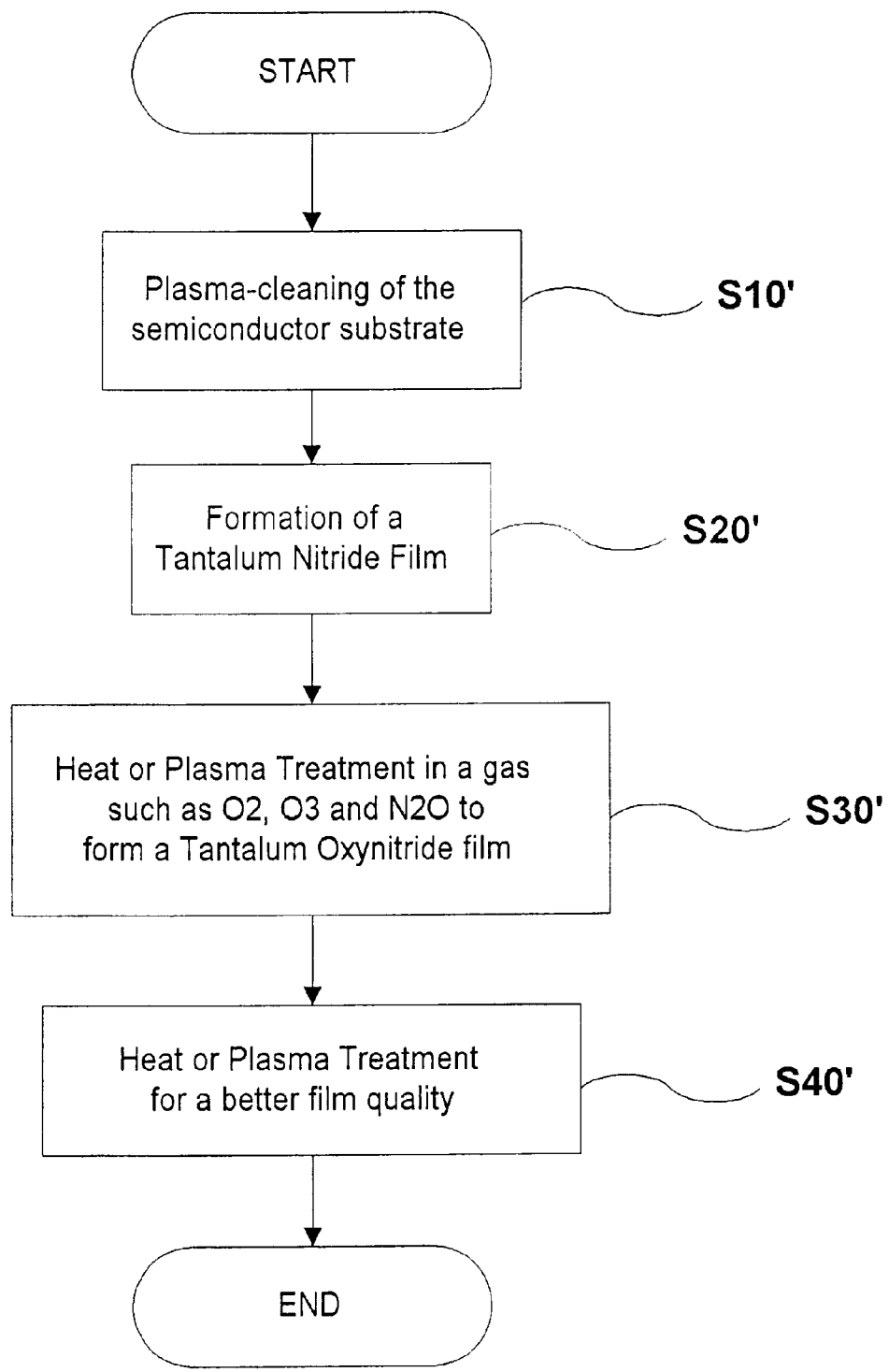
Figure 2A:
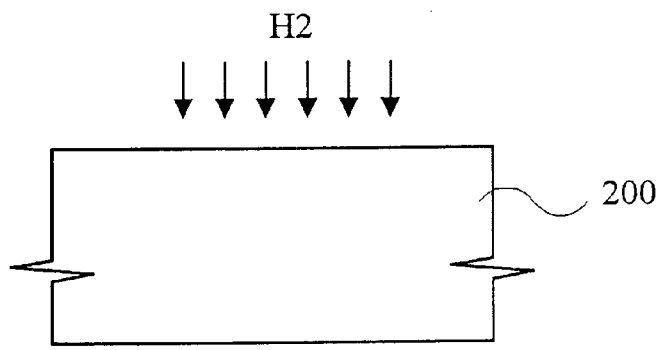
FIGS. 2A through 2C, illustrate, in cross section, process steps in the formation of a tantalum oxynitride film according to a first embodiment of the present invention.
Figure 2B:
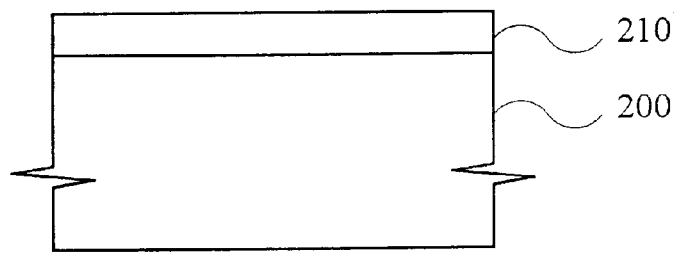
Figure 2C:
Figure 2C:
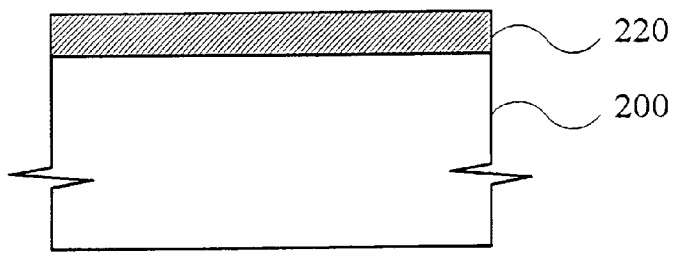

Referring to FIGS. 1A and 2A, a semiconductor substrate 200 is first cleaned by plasmas of a hydrogen gas (S10). A tantalum oxide film 210 is then formed on the semiconductor substrate 200 mounted in a reactor of semiconductor processing equipment as shown in FIG. 2B (S20). In the step S20 of forming the tantalum oxide film 210, the source of tantalum is preferably selected from the group consisting of TaCl$_5$, Ta(N(CHO)$_2$)$_5$, Ta(N(C$_2$O$_5$)$_2$)$_5$, Ta(N(COR)$_2$)$_5$, Ta(NR$_2$)$_5$, Ta(OC$_2$H$_5$)$_{5-n}$(OCH$_2$CH$_2$OR)$_n$, and Ta(OC$_2$H$_5$)$_5$, wherein $1 \leq n \leq 5$ and n is an integer and R is an alkyl group such as CH$_3$, C$_2$H$_5$, C$_3$H$_8$, or C$_4$H$_{10}$. In forming the tantalum oxide film 210, the tantalum source compound gas is supplied to the reactor at a flow rate in the range of 0.01 sccm to 1 slm. The deposition pressure is set to be between 1 mTorr and 100 Torr, and the deposition temperature is set to be between 100° C. and 900° C. in the reactor. The deposited tantalum oxide film 210 is then heat or plasma-treated in a reactive gas selected from the nitrogen-containing gas group consisting of N$_2$, NH$_3$ and N$_2$O, converted into a tantalum oxynitride film 220 as shown in FIG. 2C (S30). At this time, the process conditions are controlled to form a tantalum oxynitride film 220 in which the stoichiometric ratio of nitrogen to oxygen is 1:4. The tantalum oxynitride film is next subjected to a plasma treatment performed in a hydrogen-containing gas ambient to enhance the film quality (S40). Instead, the tantalum oxynitride film may be subjected to a plasma treatment performed using the plasmas of a gas selected from the group consisting of an oxygen-containing compound gas and a nitrogen-containing compound gas.

EXAMPLE 2

A semiconductor substrate is first cleaned by plasmas of a hydrogen gas (S10'). A tantalum nitride film is then formed on the semiconductor substrate mounted in a reactor of semiconductor processing equipment (S20'). In the step of forming the tantalum nitride film (S20'), the source of tantalum is preferably selected from the group consisting of TaCl$_5$, Ta(N(CHO)$_2$)$_5$, Ta(N(C$_2$O$_5$)$_2$)$_5$, Ta(N(COR)$_2$)$_5$, Ta(NR$_2$)$_5$, Ta(OC$_2$H$_5$)$_{5-n}$(OCH$_2$CH$_2$OR)n, and Ta(OC$_2$H$_5$)$_5$, wherein $1 \leq n \leq 5$ and n is an integer and R is an alkyl group such as CH$_3$, C$_2$H$_5$, C$_3$H$_8$, or C$_4$H$_{10}$. In forming the tantalum nitride film, the tantalum source compound gas is supplied to the reactor at a flow rate in the range of 0.01 sccm to 1 shn. The deposition pressure is set to be between 1 mTorr and 100 Torr, and the deposition temperature is set to be between 100° C. and 900° C. in the reactor. The deposited tantalum nitride film is then heat or plasma-treated in a reactive gas selected from the nitrogen-containing gas group consisting of O$_2$, O$_3$ and N$_2$O, converted into a tantalum oxynitride film (S30'). At this time, the process conditions are controlled to form a tantalum oxynitride film in which the stoichiometric ratio of nitrogen to oxygen is 1:4. In order to enhance the film quality, the tantalum oxynitride film is next subjected to the same treatment as described in the example 1 (S40').

According to the present invention, a tantalum oxynitride film is used as a high permittivity dielectric material, instead of a Ta$_2$O$_5$ film. The tantalum oxynitride film provides the following superior film properties to conventional high permittivity dielectric films for use in a semiconductor device.

The tantalum oxynitride film has a high thermal stability, such that a capacitor can be formed in which the interface heterogeniety between upper and lower electrodes is small, and current leakage due to oxygen vacancy is reduced.

Moreover, the tantalum oxynitride film can be easily formed using process conditions established in prior art processes.

What is claimed is:

1. A method for forming a high-permittivity dielectric film in semiconductor processing equipment, the method comprising the steps of:

placing a semiconductor substrate in a reactor of said processing equipment;

forming a tantalum-containing film on said semiconductor substrate; and treating said tantalum-containing film in a reactive gas to convert said tantalum-containing film into a tantalum oxynitride film, wherein the source of tantalum is selected from the group consisting of TaCl$_5$, Ta(N(CHO)$_2$)$_5$, Ta(N(C$_2$O$_5$)$_2$)$_5$, Ta(COR)$_2$)$_5$, Ta(NR$_2$)$_5$, Ta(OC$_2$H$_5$)$_{5-n}$(OCH$_2$CH$_2$OR)$_n$, and Ta(OC$_2$H$_5$)$_5$ in the step of forming said tantalum-containing film, where $1 \leq n \leq 5$, n is an integer, and R is an alkyl group, and wherein said treatment is a heat treatment or a plasma treatment.

2. The method of claim 1, wherein said tantalum-containing film is a tantalum oxide film and said reactive gas is selected from the nitrogen-containing gas group consisting of N$_2$, NH$_3$ and N$_2$O.

3. The method of claim 1, wherein said tantalum-containing film is a tantalum nitride film and said reactive gas is selected from the oxygen-containing gas group consisting of O$_2$, O$_3$ and N$_2$O.

4. The method of claim 2, wherein the stoichiometric ratio of nitrogen to oxygen in said tantalum oxynitride film is in the range of 1:9~3:2.

5. The method of claim 3, wherein the stoichiometric ratio of nitrogen to oxygen in said tantalum oxynitride film is in the range of 1:9~3:2.

6. The method of claim 2, further comprising the step of cleaning the surface of said semiconductor substrate using the plasmas of a hydrogen-containing gas prior to the formation of said tantalum-containing film.

7. The method of claim 3, further comprising the step of cleaning the surface of said semiconductor substrate using the plasmas of a hydrogen-containing gas prior to the formation of said tantalum-containing film.

8. The method of claim 2, further comprising the step of plasma treating said tantalum oxynitride film using the plasmas of a gas selected from the group consisting of an oxygen-containing compound gas, a nitrogen-containing compound gas, and a hydrogen-containing compound gas after the formation of said tantalum oxynitride film.

9. The method of claim 3, further comprising the step of plasma treating said tantalum oxynitride film using the plasmas of a gas selected from the group consisting of an oxygen-containing compound gas, a nitrogen-containing compound gas, and a hydrogen-containing compound gas after the formation of said tantalum oxynitride film.

* * * * *